(12) United States Patent
Myeong et al.

(10) Patent No.: US 10,743,430 B2
(45) Date of Patent: Aug. 11, 2020

(54) FOLDABLE DISPLAY DEVICE

(71) Applicant: Samsung Display Co., Ltd., Yongin-Si, Gyeonggi-Do (KR)

(72) Inventors: Man Sik Myeong, Seoul (KR); Han Sun Ryou, Seoul (KR); Sung Chul Choi, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/111,020

(22) Filed: Aug. 23, 2018

(65) Prior Publication Data

US 2019/0208656 A1 Jul. 4, 2019

(30) Foreign Application Priority Data

Dec. 29, 2017 (KR) ........................ 10-2017-0184509

(51) Int. Cl.
*H05K 5/02* (2006.01)
*H01L 51/52* (2006.01)
*H05K 5/00* (2006.01)
*E05D 7/00* (2006.01)
*E05D 3/12* (2006.01)
*G09F 9/30* (2006.01)
*H01L 51/00* (2006.01)

(52) U.S. Cl.
CPC .......... *H05K 5/0226* (2013.01); *E05D 3/122* (2013.01); *E05D 7/00* (2013.01); *G09F 9/301* (2013.01); *H01L 51/5237* (2013.01); *H05K 5/0017* (2013.01); *E05Y 2900/606* (2013.01); *H01L 51/0097* (2013.01); *H01L 2251/5338* (2013.01)

(58) Field of Classification Search
CPC .... H05K 5/0226; H05K 5/0017; E05D 3/122; E05D 7/00; H01L 51/5237
See application file for complete search history.

(56) References Cited

U.S. PATENT DOCUMENTS

| 8,228,667 | B2* | 7/2012 | Ma ........................ G06F 1/1652 |
| | | | 361/679.01 |
| 9,086,850 | B2* | 7/2015 | Verschoor ............. G06F 1/1652 |
| 9,173,288 | B1* | 10/2015 | Kim ....................... G06F 1/1633 |
| 9,848,502 | B1* | 12/2017 | Chu ......................... E05D 7/00 |

(Continued)

FOREIGN PATENT DOCUMENTS

| KR | 10-2015-0092773 A | 8/2015 |
| KR | 10-2016-0056445 A | 5/2016 |

(Continued)

*Primary Examiner* — Hoa C Nguyen
*Assistant Examiner* — Keith DePew
(74) *Attorney, Agent, or Firm* — Innovation Counsel LLP

(57) ABSTRACT

A foldable display device according to an exemplary embodiment includes: a display panel; a pair of rear surface supporters supporting a rear surface of the display panel; a fastener fastening the pair of rear surface supporters; and a pair of pivots respectively connecting the fastener and the pair of rear surface supporters, wherein a position of the pivot is determined by an equation below.

$$Dh=Dm-(2\times Oh) \qquad [\text{Equation}]$$

Here, Dm represents an interval when the pair of rear surface supporters are folded in parallel, Dh represents a horizontal distance between centers of the pair of pivots, Oh represents an offset of the pivot, and the offset of the pivot is a value obtained by subtracting an upper surface height of the rear surface supporter when the rear surface.

20 Claims, 15 Drawing Sheets

(56) References Cited

U.S. PATENT DOCUMENTS

| | | | |
|---|---|---|---|
| 2010/0024169 A1* | 2/2010 | Self | A47K 3/36 |
| | | | 16/354 |
| 2010/0064564 A1* | 3/2010 | Bemelmans | G06F 1/1601 |
| | | | 40/607.01 |
| 2013/0021762 A1* | 1/2013 | van Dijk | G06F 1/1652 |
| | | | 361/749 |
| 2013/0037228 A1 | 2/2013 | Verschoor | |
| 2013/0322004 A1* | 12/2013 | Park | F16C 11/10 |
| | | | 361/679.27 |
| 2014/0111954 A1* | 4/2014 | Lee | G06F 1/1641 |
| | | | 361/749 |
| 2016/0295709 A1* | 10/2016 | Ahn | H05K 5/0017 |
| 2016/0302316 A1* | 10/2016 | Jeong | G05B 11/01 |
| 2017/0295654 A1* | 10/2017 | Choi | H05K 5/0017 |
| 2017/0374749 A1* | 12/2017 | Lee | E05D 11/0054 |
| 2018/0146560 A1* | 5/2018 | Chen | H05K 5/0017 |
| 2018/0279489 A1* | 9/2018 | Ochi | E05D 7/00 |
| 2018/0335679 A1* | 11/2018 | Hashimoto | G02F 1/167 |

FOREIGN PATENT DOCUMENTS

| | | |
|---|---|---|
| KR | 10-2016-0083608 A | 7/2016 |
| KR | 10-2016-0141059 A | 12/2016 |
| KR | 10-1727971 B1 | 4/2017 |

\* cited by examiner

| Case | ⓐ | ⓑ | ⓒ | ⓓ |
|---|---|---|---|---|
| Offset length | −0.5mm Offset | +0.75mm Offset | −0.5mm Offset | +0.75mm Offset |
| Hinge Distance between hinges | No change | No change | Hinge Distance between hinges 0.5mm Decreasing | Hinge Distance between hinges 0.75mm Decreasing |
| Defect generated during folding | Buckling generation  | Crack generation / delamami generation  | Buckling generation  |  |

FOLDABLE DISPLAY DEVICE

CROSS-REFERENCE TO RELATED APPLICATION

This application claims priority to and the benefit of Korean Patent Application No. 10-2017-0184509 filed in the Korean Intellectual Property Office on Dec. 29, 2017, the entire contents of which are incorporated herein by reference.

BACKGROUND

(a) Field

The present disclosure relates to a foldable display device, and in detail, relates to a foldable display device including a folding structure.

(b) Description of the Related Art

A display device such as an organic light emitting diode display, etc. includes a display panel, and the display panel is manufactured to include several layers and elements on a substrate. Glass is used as a substrate of a conventional display panel. However, because the glass substrate is rigid, it is difficult to bend or deform the display device. Recently, a flexible display device using a flexible substrate that is light and easy to deform has been developed.

The flexible display device may be classified into a bendable display device, a foldable display device, a rollable display device, and a stretchable display device depending on its application and form. Among them, the foldable display device has a structure such that the display device may be folded. When bending the display device, a plurality of layers in the foldable display device may be separate each other and are deformed such that reliability of the display device may be deteriorated.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments prevent the display panel from being damaged when bending the foldable display device including a folding structure.

A foldable display device according to an exemplary embodiment of the present inventive concept includes: a display panel; a pair of rear surface supporters supporting a rear surface of the display panel; a fastener fastening the pair of rear surface supporters; and a pair of pivots respectively connecting the fastener and the pair of rear surface supporters, wherein a position of the pivot is determined by the equation below.

$$Dh=Dm-(2\times Oh)$$ [Equation]

Here, Dm represents an interval when the pair of rear surface supporters are folded in parallel, Dh represents a horizontal distance between centers of the pair of pivots, Oh represents an offset of the pivot, and the offset of the pivot is a value obtained by subtracting an upper surface height of the rear surface supporter when the rear surface supporter is unfolded from the height of the pivot.

The pair of pivots may have the same offset value.

The pair of pivots may become closer if the offset value increases and may be become farther away if the offset value decreases.

A reference position of the pair of pivots may be determined when the offset value is 0.

The pivot is disposed on a line extending along a line having an angle of 45 degrees with respect to a surface of a rear surface supporter.

The offset Oh value of the pivot may satisfy the equation below.

$$-Tp \leq Oh \leq 1.5 \times Tp$$ [Equation]

Here, Tp is a thickness of the display panel.

The offset Oh value of the pivot may satisfy the equation below.

$$Oh < Dm/2$$ [Equation]

The pair of rear surface supporters may each include a connection part.

Each connection part may include a hole.

The fastener may further include a pair of coupling parts having an "H" structure.

The fastener may further include a supporter connecting the pair of coupling parts.

Two connection parts may be inserted to both sides of the coupling part having the "H" structure of the fastener.

The fastener may include a hole, and the pivot may be inserted through the hole formed at the connection part and the hole formed at the fastener to fasten the rear surface supporter and the fastener together.

The pivot may have a pin shape.

A gear may be formed in each of two connection parts, and two gears may be engaged to each other.

A motor rotating the two gears may be further included.

The connection part may have a thickness equivalent to the thickness of the rear surface supporter.

The connection part may be thicker than the thickness equivalent to the thickness of the rear surface supporter.

The rear surface supporter may include a guide preventing detachment when the display panel is folded.

The guide maybe formed along one side of the display panel.

According to exemplary embodiments, even if the foldable display device including the folding structure is folded, excessive stress is not generated in the display panel such that reliability is maintained even if the display device is folded and then unfolded.

DETAILED DESCRIPTION OF THE EMBODIMENTS

Figure 1:
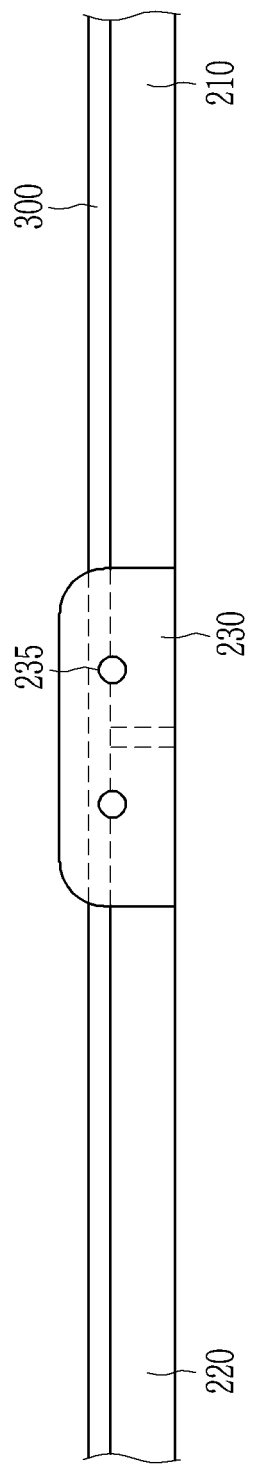
FIG. 1 is a lateral view of a foldable display device according to an exemplary embodiment of the present inventive concept.

Hereinafter, the present inventive concept will be described more fully with reference to the accompanying drawings, in which exemplary embodiments of the inventive concept are shown. As those skilled in the art would realize, the described embodiments may be modified in various different ways, all without departing from the spirit or scope of the present inventive concept.

Parts that are irrelevant to the description will be omitted to clearly describe the present inventive concept, and the same elements will be designated by the same reference numerals throughout the specification.

In addition, the size and thickness of each configuration shown in the drawings are arbitrarily shown for better understanding and ease of description, but the present inventive concept is not limited thereto. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Next, a foldable display device according to an exemplary embodiment of the present inventive concept is described with reference to FIG. 1.

FIG. 1 is a lateral view of a foldable display device according to an exemplary embodiment of the present inventive concept.

The foldable display device according to the present exemplary embodiment includes a display panel 300, a pair of rear surface supporters 210 and 220 supporting a rear surface of the display panel, a fastener 230 fastening the pair of rear surface supporters 210 and 220 together, and a pivot 235 connecting the pair of rear surface supporters 210 and 220 and the fastener 230 together. The pivot 235 is fastened so that the pair of rear surface supporters 210 and 220 may be rotated with respect to the pivot 235. Here, the pair of rear surface supporters 210 and 220, the fastener 230, and the pivot 235 are collectively called a folding structure.

The display panel 300 is formed on a plastic substrate, thereby having a flexible characteristic, and in the present exemplary embodiment, an organic light emitting panel is used. In the case of the organic light emitting panel, the display panel 300 is suitable to be used for the flexible display device in which display luminance is not changed even when being bent or folded. According to an exemplary embodiment, the display panel 300 may include a touch sensing function. The display panel 300 having the touch sensing function may be formed with an integrated panel or may have a structure in which the organic light emitting panel and a touch sensing panel are combined. According to an exemplary embodiment, a display panel other than the organic light emitting panel may be used.

The pair of rear surface supporters 210 and 220 are disposed at the rear surface of the display panel 300. Each of the rear surface supporters 210 and 220 has a structure in which the display panel 300 is divided in half and is supported. FIG. 1 shows a center partial part of the display device, however both ends of the display panel 300 may have a structure such that the rear surface is supported by each of the rear surface supporters 210 and 220. As shown in FIG. 1, the pair of rear surface supporters 210 and 220 have a structure such that they may be folded apart by a predetermined interval. A part of the display panel 300 is not supported by this interval, however the corresponding interval is not large such that the display panel 300 does not sag.

FIG. 1 shows the structure in which the rear surface supporters 210 and 220 are disposed on the display panel 300, however according to an exemplary embodiment, the rear surface supporters 210 and 220 may have a structure that is capable of preventing the display panel 300 from being released from the rear surface supporters 210 and 220 during folding. That is, referring to FIG. 12, the rear surface supporters 210 and 220 may be formed to enclose a part of the side surface of the display panel 300 to control a movement of the display panel during folding, thereby preventing it from being released.

The fastener 230 has a width that can overlap both rear surface supporters 210 and 220. The fastener 230 and the rear surface supporters 210 and 220 are fastened by using the pivot 235 at portions where both rear surface supporters 210 and 220 and the fastener 230 overlap. The pivot 235 is inserted into a hole positioned at the fastener 230 to be connected with the rear surface supporters 210 and 220. When the foldable display device is assembled, since the pivot 235 is positioned in the hole of the fastener 230, the hole may not be seen.

The foldable display device according to an exemplary embodiment of the present inventive concept has a structure such that each of the rear surface supporters 210 and 220 is rotated with respect to the pivot 235. In this case, the interval between the rear surface supporters 210 and 220 and the structure may be changed to prevent interference between the two rear surface supporters 210 and 220. According to an exemplary embodiment, the rear surface supporters 210 and 220 may have connection parts to be connected to the pivot 235 and the fastener 230.

If the pair of rear surface supporters 210 and 220 are folded while being rotated with respect to the pivot 235, the display panel 300 supported by the rear surface supporters 210 and 220 is also folded together therewith.

Figure 2:
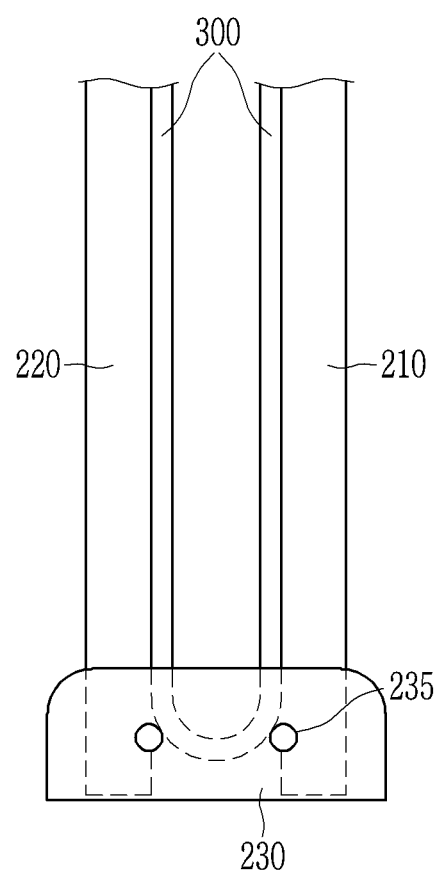
FIG. 2 is a view showing a structure in which a foldable display device of FIG. 1 is folded.

The structure in which the foldable display device according to an exemplary embodiment of the present inventive concept is folded is shown in FIG. 2.

FIG. 2 is a view showing a structure in which a foldable display device of FIG. 1 is folded, and if the foldable display device is folded by rotating the rear surface supporters 210 and 220 with respect to the pivot 235, the structure as shown in FIG. 2 is formed.

The display panel 300 is folded along the rear surface supporters 210 and 220. As a result, the part forming a curved surface among the display panel 300 is positioned away from the rear surface supporters 210 and 220, and the curved surface may have a radius R. Here, the radius R is measured based on the rear surface of the display panel 300, and is a radius of the curved surface formed by the rear surface of the display panel 300. However, a structure of which the radius is not constant according to the folded structure may be formed.

In FIG. 2, the structure in which the rear surface supporters 210 and 220 are folded to be parallel to each other is shown, however in actual use, the rear surface supporters 210 and 220 may be folded more.

In the foldable display device folded with this structure, stress applied to the display panel 300 is changed according to the position of the pivot 235, and hereinafter the position of the pivot 235 according to an exemplary embodiment of the present inventive concept is described with reference to FIG. 3.

Figure 3:
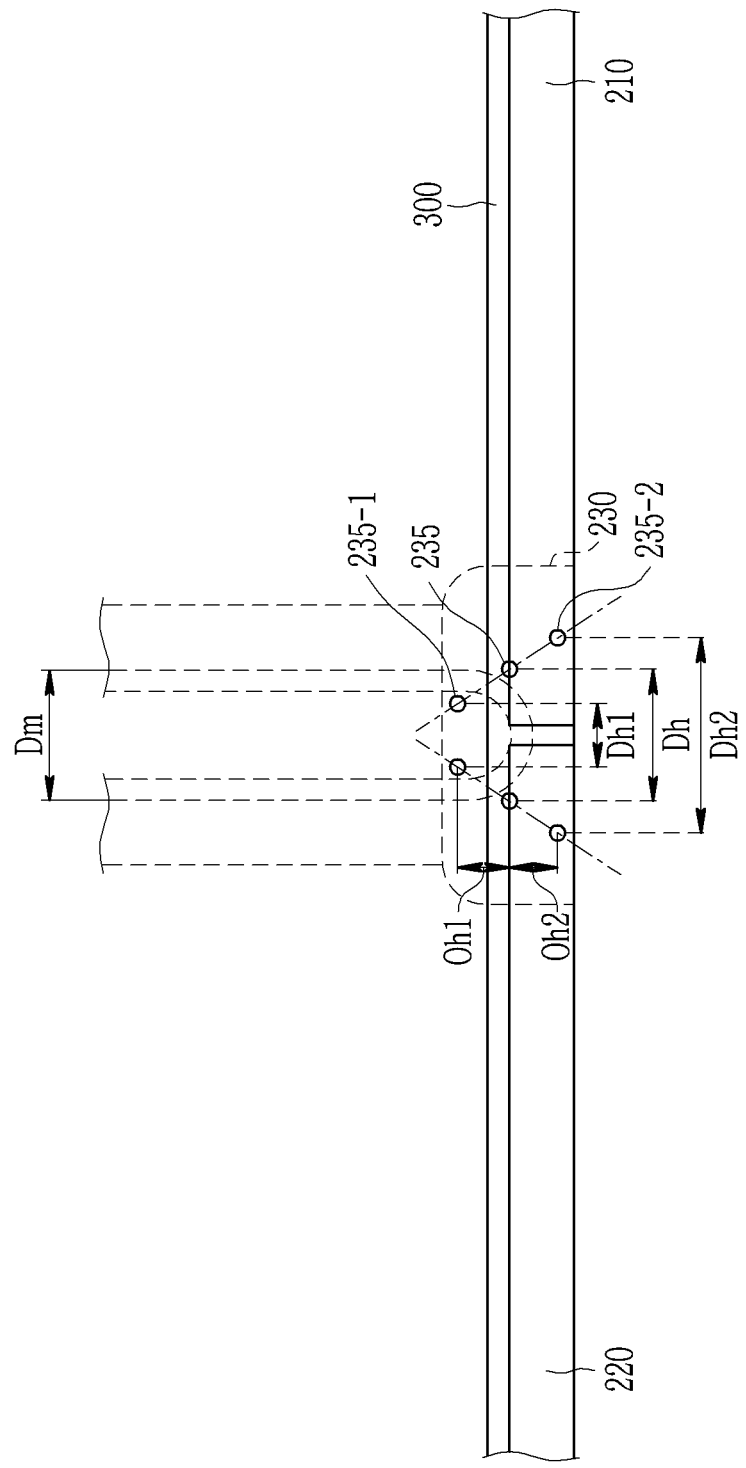
FIG. 3 is a view showing a position of a pivot in a foldable display device according to an exemplary embodiment of the present inventive concept.

FIG. 3 is a view showing a position of a pivot in a foldable display device according to an exemplary embodiment of the present inventive concept.

In FIG. 3, several numerical values are used to obtain the pivot position.

When being folded to be parallel, the interval between the pair of rear surface supporters 210 and 220 is referred to as Dm. That is, when folding the pair of rear surface supporters 210 and 220 to be parallel to each other, the interval is a distance formed by the upper surfaces of the two rear surface supporters 210 and 220, and it is the same as the interval formed by the rear surface of the display panel 300 when being folded in parallel. Also, since the radius R when the display panel 300 is folded is based on the rear surface of the display panel 300, Dm may be twice the radius R.

Also, a horizontal distance between two pivots 235 is referred to as Dh. Dh is not the interval between two pivot 235, but is the distance between centers of the two pivots 235, The center of the pivot 235 may match the center of the hole in the fastener 230.

An offset is defined as a distance between the upper surface of the rear surface supporters 210 and 220 and the center of the pivot 235 when the display device is unfolded. That is, the offset of the pivot 235 is defined as in the following Equation 1.

An offset $Oh$ of the pivot=the height of the pivot−the upper surface height of the unfolded rear surface supporter. [Equation 1]

The offset value of the pivot 235 may have a positive value or a negative value. The offset having the positive value means that the height of the pivot 235 is higher than the upper surface of the unfolded rear surface supporters 210 and 220, and the offset of the negative value means that the height of the pivot 235 is lower than the upper surface of the unfolded rear surface supporters 210 and 220.

When using three values as above, that is, the interval Dm between the rear surface supporters when being folded, the horizontal distance Dh between the pivots, and the offset Oh of the pivot, the pivot 235 of the foldable display device may satisfy the following Equation 2.

$Dh=Dm-(2\times Oh)$ [Equation 2]

That is, the horizontal distance Dh between the pivots matches the interval Dm between the rear surface supporters when being folded in parallel minus twice the offset Oh value of the pivot. Here, since the values Dh and Dm may both have a positive value, the offset Oh value of the pivot may satisfy the following Equation 3.

$Oh<Dm/2$ [Equation 3]

That is, when the offset Oh value of the pivot is the same as the value of Dm/2, the Dh value becomes 0 such that the horizontal distance between the pivots does not exist. The horizontal distance Dh between the pivots may have some numerical value to ensure the rear surface supporters 210 and 220 that are fixed to the pivot 235 may rotate.

If such a relationship is used, when the interval Dm between the rear surface supporters 210 and 220 when folded is determined in consideration of a design, it is helpful to obtain the height (the offset) of the pivot 235 and the interval. That is, if at least one among the three numerical values presented in Equation 2 is determined, the remaining numerical values may be easily determined, no matter which is determined first, however it may be common to determine the interval Dm between the rear surface supporters first. If one display panel 300 is selected for the foldable display device, the radius R at which the display panel 300 can be folded may be measured. That is, because the interval Dm of the rear surface supporters is twice the radius R, the horizontal distance Dh between the pivots and the offset Oh value of the pivot may be determined based on Equation 2. The position of the pivot 235 may be selected any one of a plurality of positions in Equation 2.

In the present specification, twice the radius of the display panel 300 based on the folded outer surface of the display panel 300 becomes the interval Dm between the rear surface supporters, however if the radius is measured based on another reference, it is necessary to determine the interval Dm between the rear surface supporters by other methods.

In Equation 2, if the pivot 235 has the offset Oh value of 0, the interval Dm between the rear surface supporters and the horizontal distance Dh between the pivots have the same value. This may be confirmed from the pivot 235 positioned at the center in FIG. 3.

That is, the center of the pivot 235 positioned at the center in FIG. 3 has the same height as the horizontal surface of the rear surface supporters 210 and 220, and the offset Oh value of the pivot is 0 in Equation 1. In Equation 2, if the offset Oh value of the pivot is 0, Dm=Dh, such that the horizontal distance Dh between the pivots matches the interval Dm between the rear surface supporters when being folded to be parallel. The distance between the pivots 235 positioned at the center in FIG. 3 is shown to match the interval Dm between the rear surface supporters.

Next, a case that the pivot is positioned higher than the horizontal surface of the rear surface supporters 210 and 220 is described. This is the case for the pivot 235-1 in FIG. 3.

The pivot 235-1 has the offset value of Oh1, and the horizontal distance between the pivots 235-1 is Dh1. Accordingly, Equation 2 is changed into Equation 4 below.

$Dh1=Dm-(2\times Oh1)$ [Equation 4]

Here, since the value of Oh1 has a positive value, as the horizontal distance Dh1 between the pivots 235-1 may only have a value that is smaller than the interval Dm between the rear surface supporters, it has a value that is smaller than the horizontal distance Dh between the pivots 235 when the offset is 0 as shown in FIG. 3.

Next, a case in which the pivot is positioned lower than the horizontal surface of the rear surface supporters 210 and 220 is described. This is the case of the pivot 235-2 in FIG. 3.

The pivot 235-2 has the offset value of Oh2, and the horizontal distance between the pivots 235-2 is Dh2. Accordingly, Equation 2 is changed into Equation 5 below.

$$Dh2 = Dm - (2 \times Oh2) \qquad \text{[Equation 5]}$$

Here, since the value of Oh2 has a negative value, as the horizontal distance Dh2 between the pivots 235-2 may only have a value that is larger than the interval Dm between the rear surface supporters, it has a larger value than the horizontal distance Dh between the pivots 235 when the offset is 0 as shown in FIG. 3.

According to Equation 2, if the offset Oh of the pivot increases by 1, the horizontal distance between the pivots decreases by 2. However, since the pivot is positioned at both sides while being formed symmetrically with respect to the center line, the horizontal distance decreased by 2 means respective decreases by 1 with respect to the center line. Therefore, referring to only one pivot, as the height of the pivot is changed by 1, since its positions along right and left directions is changed by 1. Thus, locations of pivots move along a direction having an angle of 45 degrees with respect to the right and left directions.

Therefore, the position of the pivot 235 is positioned on long dash dot lines of an oblique direction shown in FIG. 3 as the offset value is changed.

In summary, the reference position of the pair of pivots 235 is determined with respect to the case that the offset value is 0. The position of the pivot 235 is determined with the direction of 45 degrees from the reference position. When the pair of pivots 235 become higher than the reference position, a distance between the pivots becomes shorter. When the pair of pivots 235 become lower than the reference position, a distance between the pivots becomes longer. Here, the height of the pair of pivots 235 is the same.

Equation 2 and the position of the pivot 235 moving with 45 degrees corresponds to the optimized case, and may be changed depending on a degree of the stress applied while the display panel 300 is folded. Also, it is natural that the height of pivot 235 must be located within the fastener 230, but it is not always possible for the height of the pivot 235 to go higher or lower.

The range that the offset may have is described in Equation 3 while satisfying the relationship of the Equation 2. However, the range that the offset may have may be additionally limited, and this is described with reference to FIG. 4 to FIG. 7.

Figure 4:
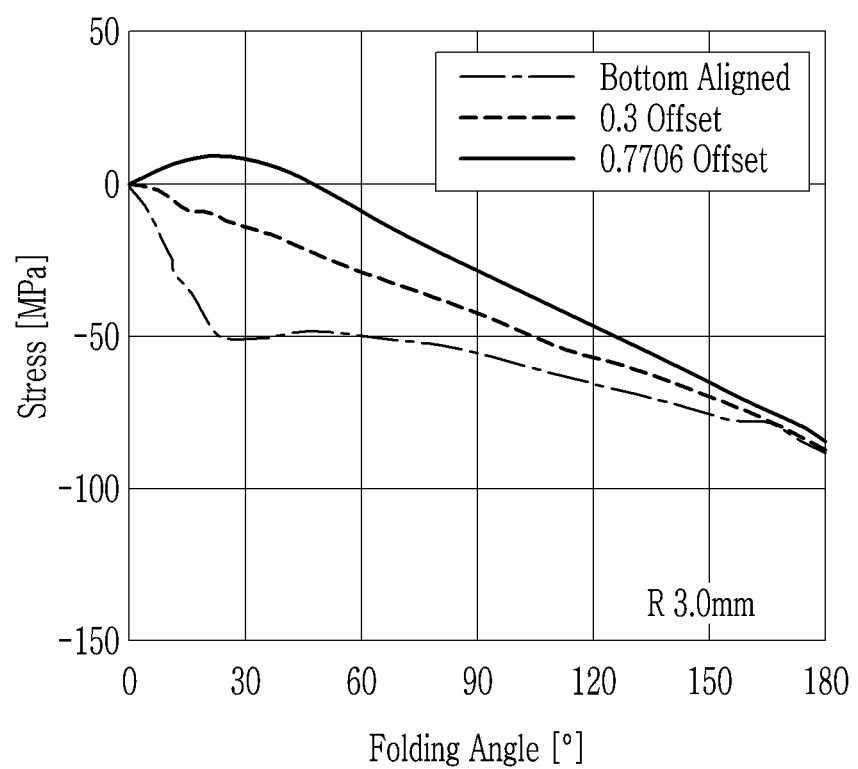
FIG. 4 is a graph of stress of a display panel according to an offset of a pivot.

FIG. 4 is a graph of stress of a display panel according to an offset of a pivot.

First, FIG. 4 shows the stress (y axis) that the display panel receives along a folding angle (x axis) of the display panel 300 as the graph. Also, FIG. 4 shows three exemplary embodiments.

In FIG. 4, "Bottom Aligned" is a case that the offset Oh of the pivot is 0, and cases that the offset Oh value of the pivot is +0.3 mm and +0.7706 mm are shown. In the exemplary embodiments of FIG. 4, the thickness of the display panel 300 is about 0.5 mm, and the folding radius R when the display panel 300 is completely folded (180 degrees) is 3.0 mm. Here, since the folding radius R of the display panel 300 is based on the outer surface when the display panel 300 is folded, if the radius R is doubled, it becomes the interval Dm between the rear surface supporters. Also, the offset Oh value of the pivot of +0.3 mm is the offset value corresponding to about half of the thickness of the display panel 300, and the case that the offset Oh value of the pivot of +0.7706 mm is the offset value corresponding to about 1.5 times of the thickness of the display panel 300.

According to FIG. 4, when the offset Oh value of the pivot is +0.3 mm, the stress is substantially proportional to the folding angle. That is, as the folding angle increases, the stress increases accordingly, however since the stress increases substantially proportional to the folding angle, there is little possibility of problems with the display panel 300.

On the other hand, when the offset Oh value of the pivot is +0.7706 mm pivot, the stress is changed from a tensile stress to a compressive stress as the folding angle increases. That is, when folding the display device, the display device receives a tensile stress when the folding angle is small. When the display device is under the tensile stress, a crack may occur in the display device. However the stress is not high enough to cause crack problem, and when the folding angle increases later, the display device is under a compression stress such that the crack problems are not generated.

When the offset Oh value of the pivot is 0 (Bottom Aligned), the display device is under a compressive stress. The compressive stress sharply increases initially. However, a changing amount of the compressive stress decreases. When considering that the stress value initially generated has the value that is relatively smaller than in the final folding (in the case of 180 degrees), the initial stress is determined to be able to be endured.

According to a trend of the stress as shown in FIG. 4, when the offset Oh value of the pivot has the negative value, the tensile stress may increase when folding the display device. Therefore, when the offset Oh value of the pivot is increased to have a large negative value, the tensile stress is too high to use.

Compared with the negative offset Oh value of the pivot, there is a merit that the stress is not largely changed when the pivot has the positive offset Oh value of the pivot. Therefore, the positive offset Oh value of the pivot may have the relatively large value, and it is difficult for the negative offset Oh value of the pivot to have a large value.

In the above, the change of the stress depending on the change of the offset Oh value of the pivot is described with reference to FIG. 4.

Next, the change of the stress depending on the change of the radius R during the folding of the display panel 300 is described with reference to FIG. 5.

Figure 5:
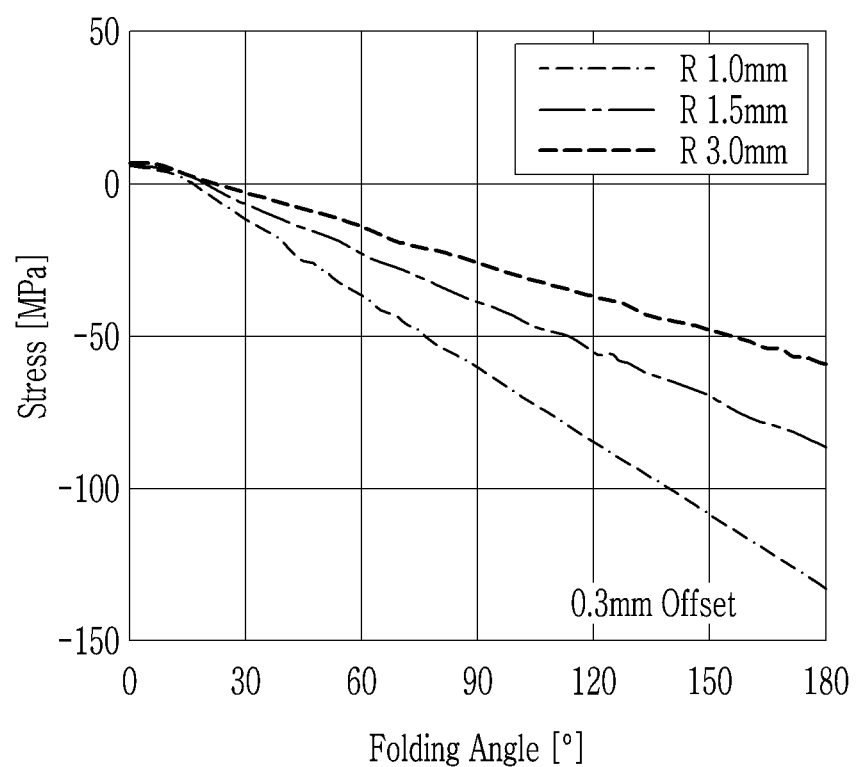
FIG. 5 is a graph of stress of a display panel according to a folding radius.

FIG. 5 is a graph of stress of a display panel according to a folding radius.

The change of the stress is described while changing the radius R when folding the display panel 300 having the offset Oh value of the pivot of +0.3 mm.

Referring to FIG. 5, as the radius R when folding the display panel 300 decreased, the stress applied to the part of the display panel 300 increases such that the radius R needs to be above a certain degree. However, if the radius R is too large, there is a drawback that its thickness is increased when the display device is folded.

Next, a deformation degree of the display panel depending on the position of the pivot 235 is described with reference to FIG. 6 and FIG. 7.

Figure 6:
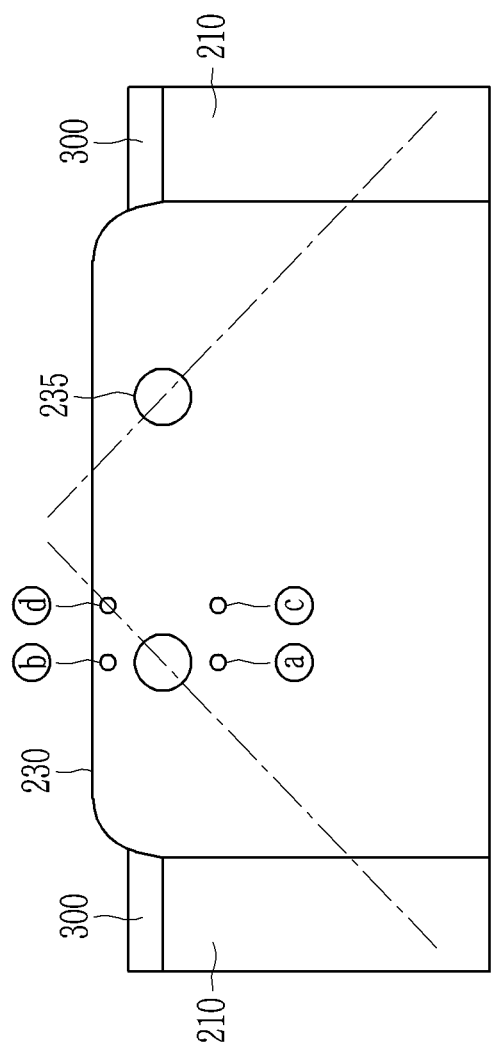
FIG. 6 and FIG. 7 are views showing a state in which a display panel is folded while changing a position of a pivot.
Figure 7:
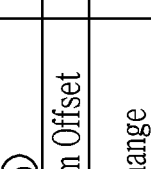
Figure 7:
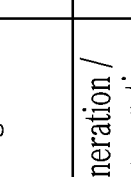
Figure 7:
Figure 7:

FIG. 6 and FIG. 7 are views for describing the folded state of the display panel while changing the position of the pivot.

First, FIG. 6 additionally shows the pivot position in a total of four places. According to Equation 2, the stress of the display panel 300 is relatively small when the pivot 235 is positioned in FIG. 6 and the pivots are disposed in the oblique direction along the long dash dot line of FIG. 6. So, the long dash dot line of FIG. 6 illustrates the positions of the pivot 235 that are suitable for the foldable display device even when being folded. Here, the reference pivot position of the pivot is the position having the offset of 0.

Based on this, in FIG. 6, the position of the pivot moves to four places, wherein the pivot ⓐ is moved downward from the position of the reference pivot 235, the pivot ⓑ is moved upward from the position of the reference pivot 235, the pivot ⓒ is moved rightward from the pivot ⓐ, and the pivot ⓓ is moved rightward from the pivot ⓑ and positioned in the oblique direction from the reference pivot 235. Next, the display panel 300 is folded with respect to each pivot, and the stress that the display panel 300 receives is shown in FIG. 7. Here, the offset value of the pivots ⓐ and ⓒ is −0.5 mm, and the offset value of the pivots ⓑ and ⓓ is +0.75 mm. Also, the distance between the pivots positioned at both sides in the pivot ⓐ and the pivot ⓑ is the same as that of the reference pivot 235. However, the distance between the two pivots is decreased by 0.5 mm compared with the reference pivot 235 for the pivot ⓒ, and the distance between two pivots for the pivot ⓓ is decreased by 0.75 mm. As a result, the pivot ⓒ is deviated from the oblique direction, however the pivot ⓓ is positioned along the oblique direction.

Also, the display panel 300 uses the panel having a thickness of 0.5 mm. The display panel 300 has a plurality of layers, which may cause a problem such as delamination between the plurality of layers.

Also, in FIG. 7, the pivot corresponding to each case is indicated by a dot along with a number '235', and the upper surface thereof instead of the rear surface supporters 210 and 220 is respectively indicated by numbers '211' and '221' while being shown with a line.

First, a case of using the pivot ⓐ is described. According to FIG. 7, when using the pivot ⓐ, it may be confirmed that a floating phenomenon is generated from the upper surfaces 211 and 221 of the rear surface supporter while buckling is generated in the display panel 300.

On the other hand, when using the pivot ⓑ, it may be confirmed that a crack is generated in the display panel 300 and delamination in which layers are separated within the display panel 300 is generated.

Also, in the case using the pivot ⓒ, the buckling is generated like the case of using the pivot ⓐ.

However, even if the pivot moves, in the case in which the pivot moves in the oblique direction from the reference pivot (the pivot ⓓ) along the dash dot line, it may be confirmed that the stress of the display panel 300 is small and the reliability is confirmed through a test of folding and unfolding tens of thousands of times.

Based on such experiment results, the offset value of pivot is required to be within a range of Equation 6.

$$-Tp \leq Oh \leq 1.5 \times Tp \quad \text{[Equation 6]}$$

Here, Oh is the offset value of the pivot, and Tp is the thickness of the display panel 300.

These numerical ranges may be confirmed through FIG. 4 and FIG. 7.

First, referring to FIG. 4, when the offset Oh value of the pivot is positive, the stress is relatively small, and since the stress is increased at the initial folding even if it is 0, it may be confirmed that it is difficult to have the offset of the large value if the offset Oh value is negative. Also, in FIG. 4, even if the offset Oh value of the pivot has a value corresponding to 1.5 times of the thickness Tp of the display panel 300, it may be confirmed that that stress does not rapidly increase, so the pivot may be used.

Further, referring to FIG. 7, even if the offset value of the pivot is −Tp, it may be confirmed the buckling is generated. However, since the case of FIG. 7 is a case in which the pivot does not move in the oblique direction from the reference pivot 235 (i.e., a case that the interval between two pivots is not changed), the buckling is generated. In contrast, even if the offset value of the pivot has the negative value of the thickness Tp of the display panel 300, if the distance between two pivots is farther away according thereto and the pivot is positioned in the oblique direction from the reference pivot 235, reliability may be obtained.

Accordingly, the offset value of the pivot like Equation 6 may be set.

Next, the foldable display device according to another exemplary embodiment of the present inventive concept is described with reference to FIG. 8 to FIG. 13.

First, the overall shape of the foldable display device is described with reference to FIG. 8 and FIG. 9.

Figure 8:
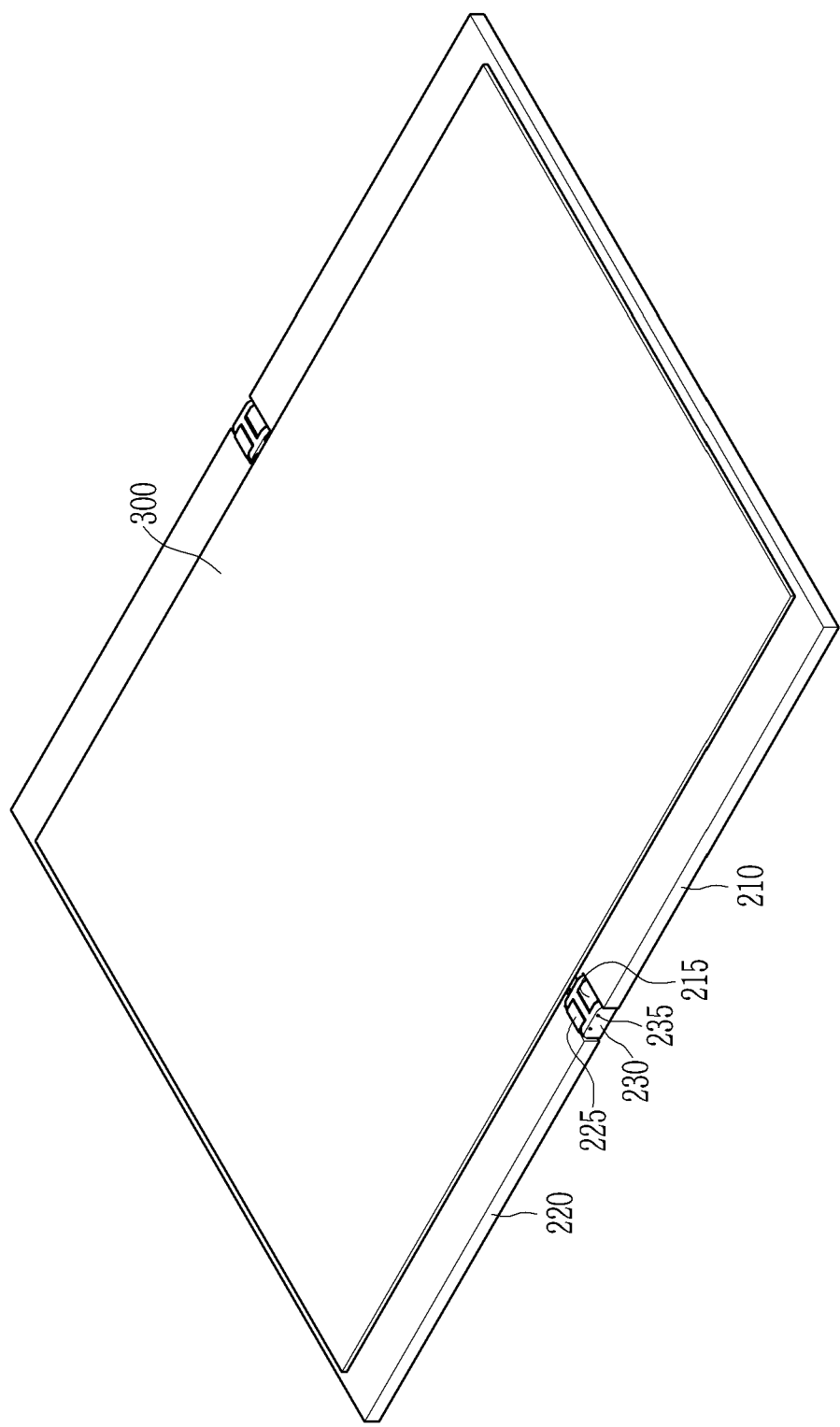
FIG. 8 is a perspective view of a foldable display device according to another exemplary embodiment of the present inventive concept.
Figure 9:
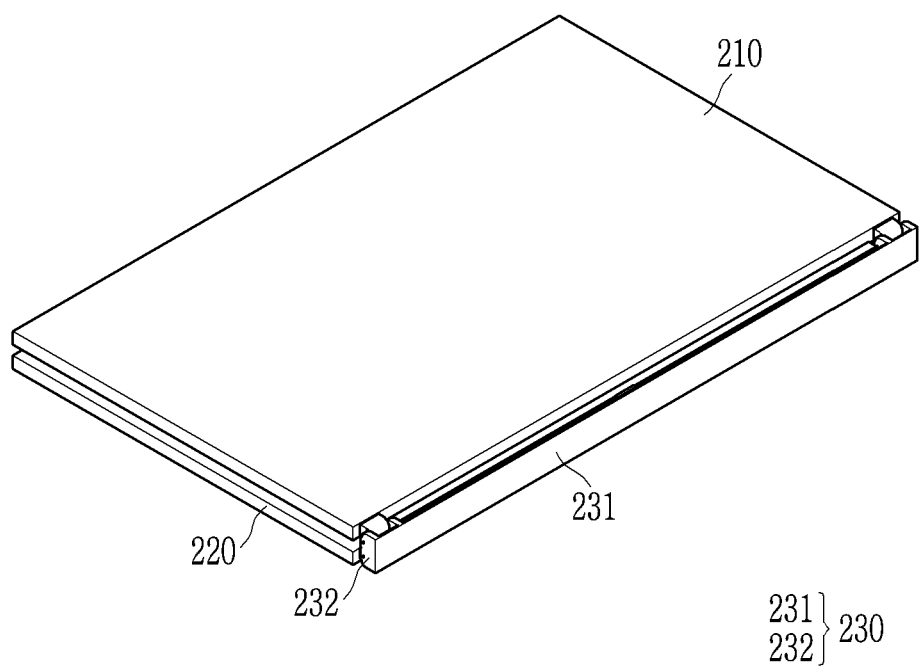
FIG. 9 is a perspective view of a folded state of a foldable display device according to an exemplary embodiment of FIG. 8.

FIG. 8 is a perspective view of a foldable display device according to another exemplary embodiment of the present inventive concept, and FIG. 9 is a perspective view of a folded state of a foldable display device according to the exemplary embodiment of FIG. 8.

FIG. 8 shows a state in which the foldable display device is unfolded.

The foldable display device according to the present exemplary embodiment includes the display panel 300, the pair of rear surface supporters 210 and 220 supporting the rear surface of the display panel, and the fastener 230 used to connect and fold the pair of rear surface supporters 210 and 220. Also, the foldable display device further include the pivot 235 so as to connect the fastener 230 to the pair of rear surface supporters 210 and 220. Here, the pair of rear surface supporters 210 and 220, the fastener 230, and the pivot 235 are together referred to as the folding structure.

The display panel 300 is formed on the plastic substrate thereby having the flexible characteristic, and may have the touch sensing function.

The pair of rear surface supporters 210 and 220 are disposed at the rear surface of the display panel 300. Each of the rear surface supporters 210 and 220 has the structure supporting the rear surface of the display panel 300.

FIG. 8 shows the structure in which the display panel 300 is disposed on the rear surface supporters 210 and 220, however according to an exemplary embodiment, the rear surface supporters 210 and 220 may be formed to enclose the side surface as well as the rear surface of the display panel 300. According to an exemplary embodiment, a protrusion shape may be provided to prevent the display panel 300 from being released, and it is described in FIG. 12.

Connection parts 215 and 225 are formed in the pair of rear surface supporters 210 and 220, and the connection parts are fastened to the fastener 230 through the pivot 235.

The pivot 235 is inserted into the hole positioned at the fastener 230 and the hole positioned at the connection parts 215 and 225 of the rear surface supporters 210 and 220, thereby connecting the rear surface supporters 210 and 220 to the fastener 230.

The foldable display device according to an exemplary embodiment of the present inventive concept has the structure such that each of the rear surface supporters 210 and 220 pivots around the pivot 235. If the pair of rear surface supporters 210 and 220 are rotated and folded based on the pivot 235, the display panel 300 supported by the rear surface supporters 210 and 220 is folded together therewith.

The structure in which the foldable display device according to the exemplary embodiment of FIG. 8 is folded is shown in FIG. 9. As shown in FIG. 9, the rear surface supporters 210 and 220 are folded while being rotated based on the pivot 235 positioned at the fastener 230. The rear surface supporters 210 and 220 are apart from each other by a predetermined interval, thereby having a space where the display panel 300 may be positioned therebetween. However, according to an exemplary embodiment, the rear surface supporters 210 and 220 may be folded until they are not further folded.

FIG. 9 shows the structure of the fastener 230, and this is described in detail with reference to FIG. 10 and FIG. 11.

Figure 10:
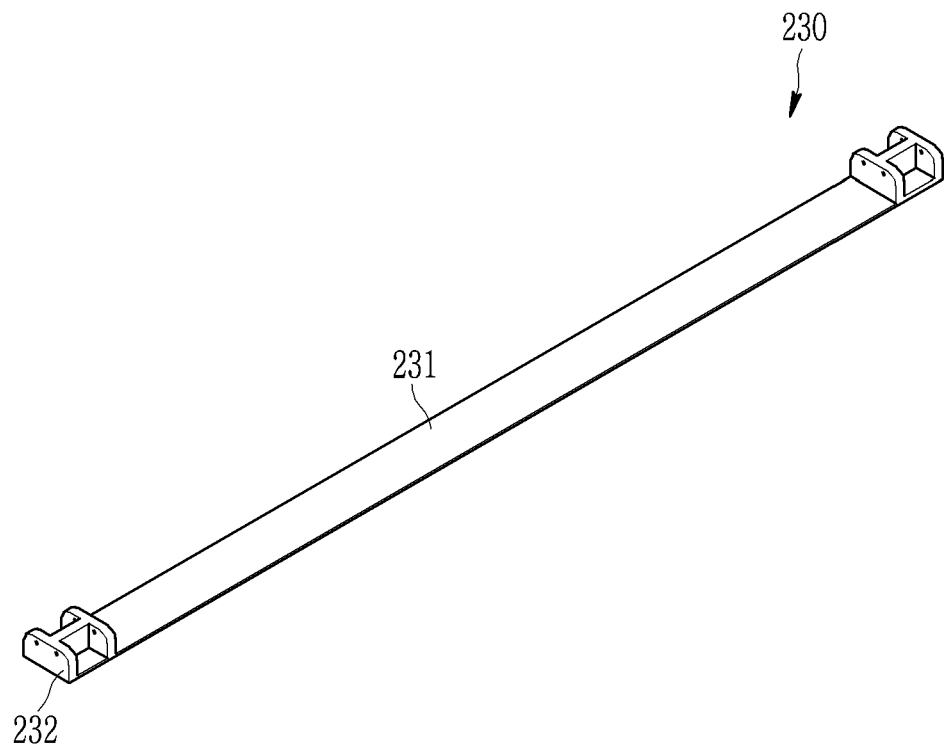
FIG. 10 is a perspective view of a fastener according to an exemplary embodiment of FIG. 8.
Figure 11:
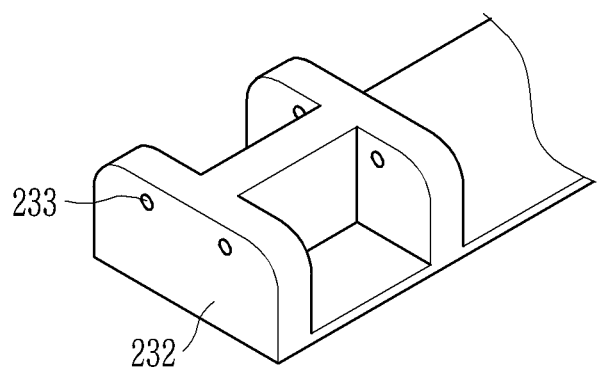
FIG. 11 is an enlarged view of one end of a fastener according to an exemplary embodiment of FIG. 8.

FIG. 10 is a perspective view of a fastener according to an exemplary embodiment of FIG. 8, and FIG. 11 is an enlarged view of one end of a fastener according to an exemplary embodiment of FIG. 8.

The fastener 230 according to the exemplary embodiment of FIG. 8 includes a pair of coupling parts 232 positioned at opposite ends and a supporter 231 connecting them. The pair of coupling parts 232 have a structure such that the connection parts 215 and 225 of the rear surface supporters 210 and 220 may be inserted.

The structure of the coupling part 232 is enlarged in FIG. 11. The coupling part 232 has an "H" shape, and a hole 233 is positioned corresponding to the place where the pivot 235 is inserted. The hole 233 is formed at the position according to Equation 2 so that the pivot 235 has the position according to Equation 2. The hole 233 is positioned at four places among the coupling part 232 of the "H" shape, and is formed so that the connection part of one rear surface supporter is fixed and rotated through two holes 233.

Next, the rear surface supporter is described with reference to FIG. 12.

Figure 12:
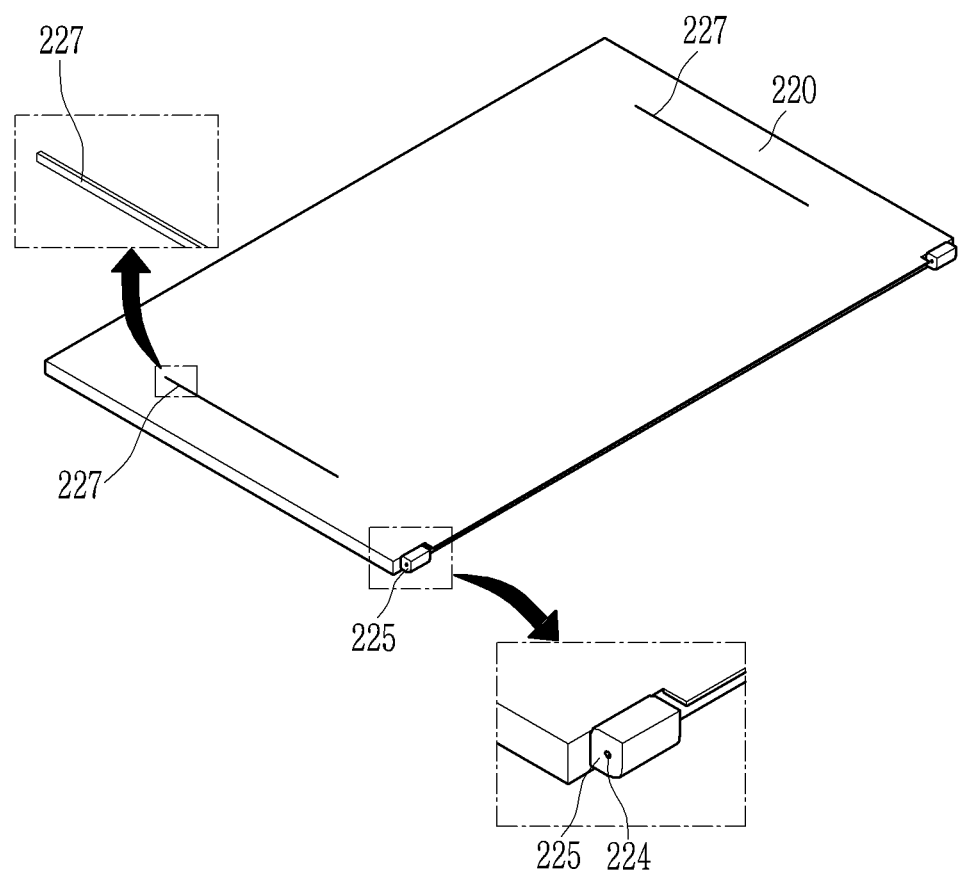
FIG. 12 is a perspective view of a rear surface supporter.

FIG. 12 is a perspective view of a rear surface supporter.

FIG. 12 shows only the rear surface supporter 220 of one side. The rear surface supporter 220 according to the exemplary embodiment of FIG. 8 has a plate structure. The connection part 225 corresponding to the coupling part 232 of the fastener 230 is positioned at one end of the plate structure. A hole 224 is also formed in the connection part 225 to correspond to the hole 233 of the coupling part 232.

Figure 13:
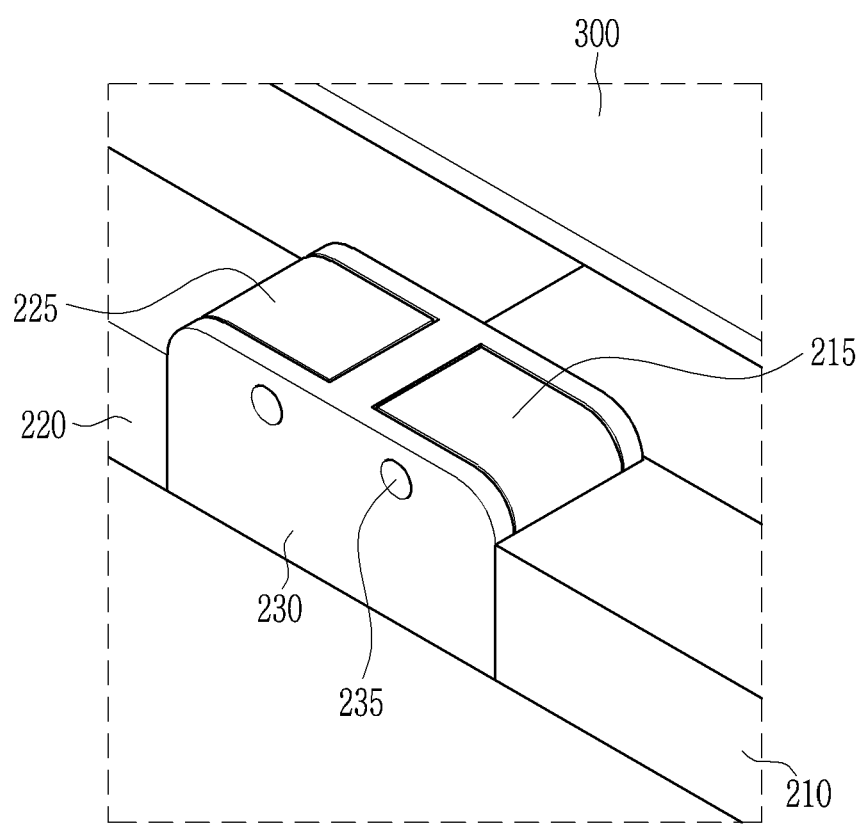
FIG. 13 is an enlarged view of a coupling part according to an exemplary embodiment of FIG. 8.
Figure 14:
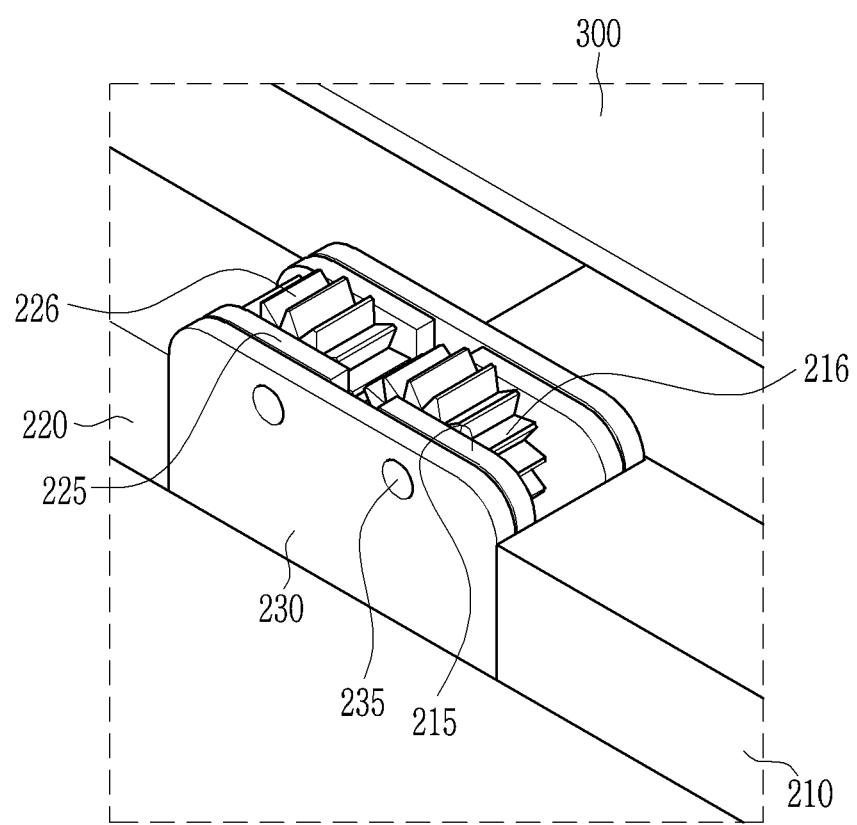
FIG. 14 is an enlarged view of a coupling part according to another exemplary embodiment of the present inventive concept.
Figure 15:
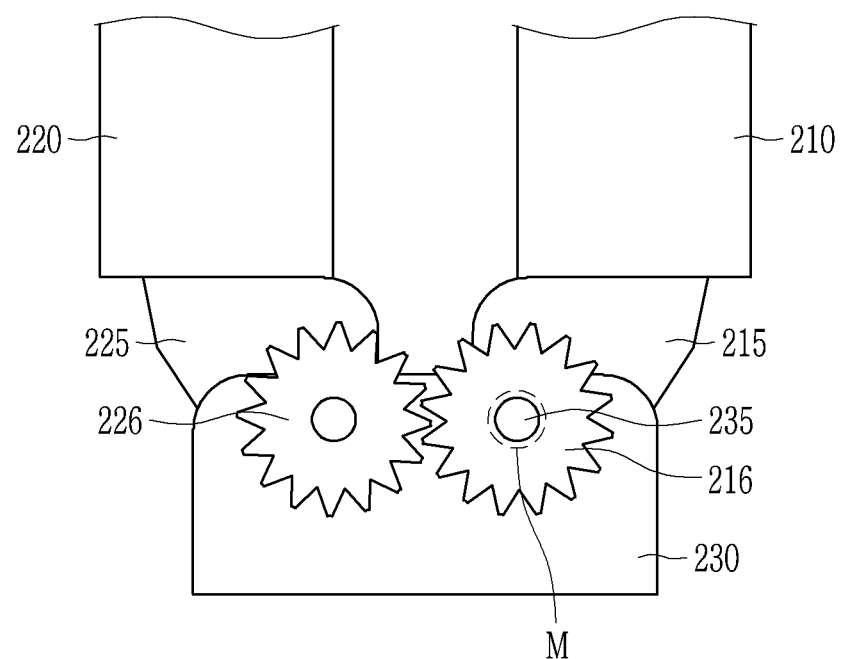
FIG. 15 is a lateral view of a foldable display device according to an exemplary embodiment of FIG. 14.

FIG. 12 shows the exemplary embodiment in which the thickness of the coupling part 232 is equivalent to the main body thickness of the rear surface supporter 220. However, as shown in FIG. 13 to FIG. 15, the structure of the coupling part 232 may be thicker than the rear surface supporter 220. This exemplary variation is also included in the scope of the present inventive concept.

Also, FIG. 12 shows a guide 227 formed to prevent the display panel 300 from being released. That is, the guide 227 is formed of a protrusion shape and is formed along one side of the display panel 300. The guide 227 is formed along the direction in which the display panel 300 is pushed while being folded such that the stress applied when the display panel 300 is pushed is not increased, thereby executing only the function of preventing the display panel 300 from being detached.

According to an exemplary embodiment, the guide 227 may have a plurality of protrusion shapes, and may be omitted according to an exemplary embodiment.

Next, the structure in which the connection part 225 and the coupling part 232 are fastened is described with reference to FIG. 13. FIG. 13 is an enlarged view of a coupling part according to an exemplary embodiment of FIG. 8.

As shown in FIG. 13, the connection part 225 is inserted in the "H" structure of the coupling part 232, and the hole 224 of the connection part 225 and the hole 233 of the coupling part 232 penetrate the pivot 235. As a result, the rear surface supporter 220 is rotated based on the pivot 235.

In the exemplary embodiment of FIG. 8, a pin is used as the pivot 235. However, an exemplary embodiment using a gear structure is described in FIG. 14 and FIG. 15.

FIG. 14 is an enlarged view of a coupling part according to another exemplary embodiment of the present inventive concept, and FIG. 15 is a lateral view of a foldable display device according to the exemplary embodiment of FIG. 14.

Compared with FIG. 13, in the exemplary embodiment of FIG. 14, gears 216 and 226 are additionally formed in the connection parts 215 and 225. Since the connection parts 215 and 225 are fastened with the gears 216 and 226, if the gears 216 and 226 are rotated, the connection parts 215 and 225 are also rotated and then the rear surface supporters 210 and 220 are also rotated. Also, two gears 216 and 226 are meshed with each other. As a result, if one of the two gears 216 and 226 is rotated based on the pivot 235, the other gear that is engaged at the opposite side is also rotated. The exemplary embodiment of FIG. 14 has a merit that the other rear surface supporter moves even if only one of the pair of rear surface supporters 210 and 220 is moved, differently from the exemplary embodiment of FIG. 13. Also, according to an exemplary embodiment, the engagement rotation of the gears 216 and 226 may be realized by using a motor (M). The motor (M) may be connected to one of the two gears 216 and 226. According to an exemplary embodiment, the motor (M) may be connected to the pivot 235, and in this case, the pivot 235 and one among the two gears 216 and 226 may be engaged to each other such that one among the gears may also be rotated together when the pivot 235 is rotated. When using the motor (M) in this way, there is a merit that the display device may be automatically folded.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A foldable display device comprising:
a display panel;
a pair of rear surface supporters supporting a rear surface of the display panel;
a fastener fastening the pair of rear surface supporters; and
a pair of pivots respectively connecting the fastener to the pair of rear surface supporters,
wherein a position of the pivot satisfies an equation below:

$$Dh = Dm - (2 \times Oh) \qquad \text{[Equation]}$$

where Dm represents an interval when the pair of rear surface supporters are folded in parallel, Dh represents a horizontal distance between centers of the pair of pivots, Oh represents an offset of the pivot, and the offset of the pivot has a positive or negative value that is equal to a difference between an upper surface height of the rear surface supporter when the rear surface supporter is unfolded and a height of the pivot.

2. The foldable display device of claim 1, wherein the pair of pivots have the same offset value.

3. The foldable display device of claim 2, wherein the pair of pivots become closer if the offset value increases and become farther away if the offset value decreases.

4. The foldable display device of claim 3, wherein a reference position of the pair of pivots is determined when the offset value is 0.

5. The foldable display device of claim 4, wherein the pivot is disposed on a line extending along a line having an angle of 45 degrees with respect to a surface of a rear surface supporter.

6. The foldable display device of claim 1, wherein the offset Oh value of the pivot satisfies the equation below:

$$-Tp \leq Oh \leq 1.5 \times Tp \quad \text{[Equation]}$$

where Tp is a thickness of the display panel.

7. The foldable display device of claim 6, wherein the offset Oh value of the pivot satisfies an equation below:

$$Oh < Dm/2. \quad \text{[Equation]}$$

8. The foldable display device of claim 1, wherein the pair of rear surface supporters each include a connection part.

9. The foldable display device of claim 8, wherein each connection part includes a hole.

10. The foldable display device of claim 9, wherein a gear is formed in each of two connection parts, and two gears are engaged to each other.

11. The foldable display device of claim 8, wherein the connection part has a thickness equivalent to the thickness of the rear surface supporter.

12. The foldable display device of claim 11, wherein the connection part is thicker than the thickness equivalent to the thickness of the rear surface supporter.

13. The foldable display device of claim 1, wherein the rear surface supporter includes a guide preventing detachment when the display panel is folded.

14. The foldable display device of claim 13, wherein the guide is formed along one side of the display panel.

15. A foldable display device comprising:
a display panel;
a pair of rear surface supporters supporting a rear surface of the display panel and each having a connection part;
a fastener fastening the pair of rear surface supporters; and
a pair of pivots respectively connecting the fastener to the pair of rear surface supporters,
wherein
the fastener further includes a pair of coupling parts having an "H" structure.

16. The foldable display device of claim 15, wherein the fastener further includes a supporter connecting the pair of coupling parts.

17. The foldable display device of claim 15, wherein two connection parts are inserted to both sides of the coupling part having the "H" structure of the fastener.

18. The foldable display device of claim 17, wherein the fastener includes a hole, and
the pivot is inserted through the hole formed at the connection part and the hole formed at the fastener to fasten the rear surface supporter and the fastener together.

19. The foldable display device of claim 18, wherein the pivot has a pin shape.

20. A foldable display device comprising:
a display panel;
a pair of rear surface supporters supporting a rear surface of the display panel and each having a connection part;
a fastener fastening the pair of rear surface supporters;
a pair of pivots respectively connecting the fastener to the pair of rear surface supporters;
a pair of gears formed in each of two connection parts; and
a motor rotating at least one of two gears,
wherein the two gears are engaged to each other.

* * * * *